(12) United States Patent
Chen et al.

(10) Patent No.: US 11,532,679 B2
(45) Date of Patent: Dec. 20, 2022

(54) METHOD OF FABRICATING ARRAY SUBSTRATE, ARRAY SUBSTRATE, AND DISPLAY APPARATUS

(71) Applicants: Mianyang BOE Optoelectronics Technology Co., Ltd., Sichuan (CN); BOE Technology Group Co., Ltd., Beijing (CN)

(72) Inventors: Zhu Chen, Beijing (CN); Kwiyoung Yun, Beijing (CN); Xin Cao, Beijing (CN); Hongcan Liu, Beijing (CN); Ming Dai, Beijing (CN); Haifeng Xu, Beijing (CN); Haoyuan Fan, Beijing (CN)

(73) Assignees: Mianyang BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 270 days.

(21) Appl. No.: 16/755,672

(22) PCT Filed: Apr. 15, 2019

(86) PCT No.: PCT/CN2019/082704
§ 371 (c)(1),
(2) Date: Apr. 13, 2020

(87) PCT Pub. No.: WO2020/210946
PCT Pub. Date: Oct. 22, 2020

(65) Prior Publication Data
US 2021/0233978 A1    Jul. 29, 2021

(51) Int. Cl.
*H01L 27/00* (2006.01)
*H01L 27/32* (2006.01)
(Continued)

(52) U.S. Cl.
CPC ...... *H01L 27/3244* (2013.01); *H01L 27/1225* (2013.01); *H01L 27/1229* (2013.01);
(Continued)

(58) Field of Classification Search
CPC ............ H01L 27/1225; H01L 27/1229; H01L 27/1251; H01L 27/1259; H01L 29/41733
See application file for complete search history.

(56) References Cited

U.S. PATENT DOCUMENTS

2011/0049523 A1    3/2011    Choi et al.
2017/0155000 A1    6/2017    Moon et al.
(Continued)

FOREIGN PATENT DOCUMENTS

CN    101997025 A    3/2011
CN    106803510 A    6/2017
(Continued)

OTHER PUBLICATIONS

International Search Report & Written Opinion dated Jan. 16, 2020, regarding PCT/CN2019/082704.

*Primary Examiner* — Reema Patel
(74) *Attorney, Agent, or Firm* — Intellectual Valley Law, P.C.

(57) ABSTRACT

A method of fabricating an array substrate is provided. The method includes forming a plurality of first thin film transistors on a base substrate, a respective one of the plurality of first thin film transistors formed to include a first active layer, a first gate electrode, a first source electrode and a first drain electrode; and forming a plurality of second thin film transistors on the base substrate, a respective one of the plurality of second thin film transistors formed to include a second active layer, a second gate electrode, a second source electrode and a second drain electrode. Forming the first source electrode includes forming a first source sub-layer
(Continued)

and forming a second source sub-layer in separate patterning steps. Forming the first drain electrode includes forming a first drain sub-layer and forming a second drain sub-layer in separate patterning steps.

17 Claims, 14 Drawing Sheets

(51) Int. Cl.
*H01L 29/66* (2006.01)
*H01L 29/786* (2006.01)
*H01L 29/417* (2006.01)
*H01L 27/12* (2006.01)

(52) U.S. Cl.
CPC .... *H01L 29/41733* (2013.01); *H01L 29/6675* (2013.01); *H01L 29/78618* (2013.01); *H01L 29/78672* (2013.01); *H01L 2227/323* (2013.01)

(56) References Cited

U.S. PATENT DOCUMENTS

| | | | |
|---|---|---|---|
| 2017/0256569 A1* | 9/2017 | Ohara | H01L 29/4908 |
| 2018/0175127 A1 | 6/2018 | Lee et al. | |
| 2018/0350848 A1 | 12/2018 | Shin et al. | |
| 2019/0006521 A1* | 1/2019 | Noh | H01L 29/78618 |

FOREIGN PATENT DOCUMENTS

| | | |
|---|---|---|
| CN | 107910302 A | 4/2018 |
| CN | 108206192 A | 6/2018 |

\* cited by examiner

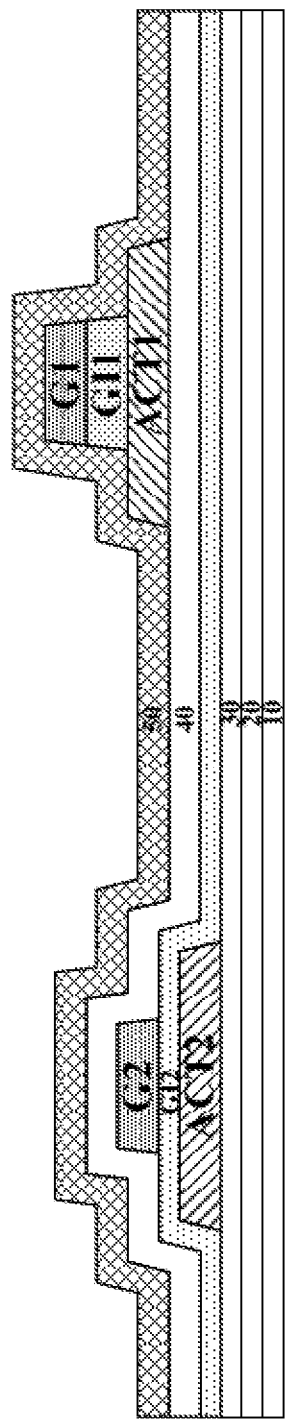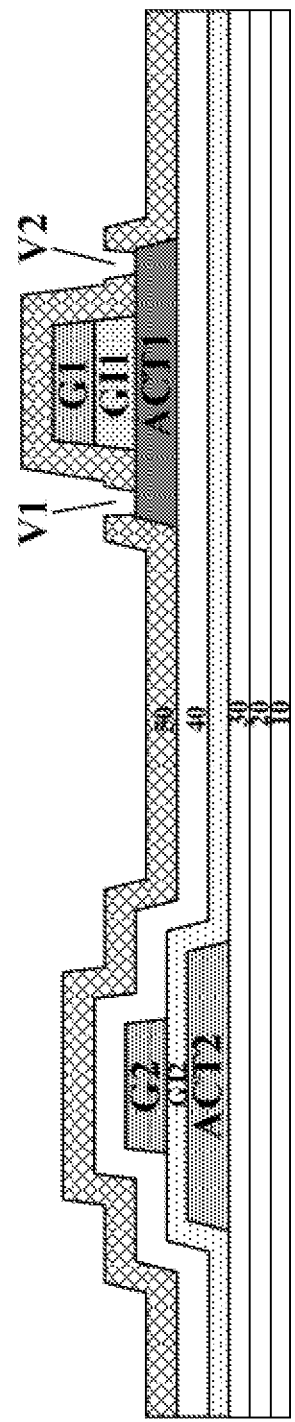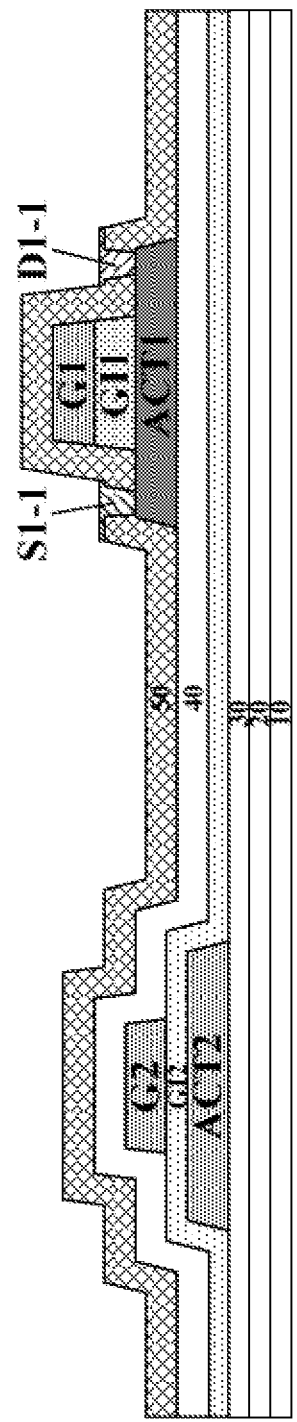

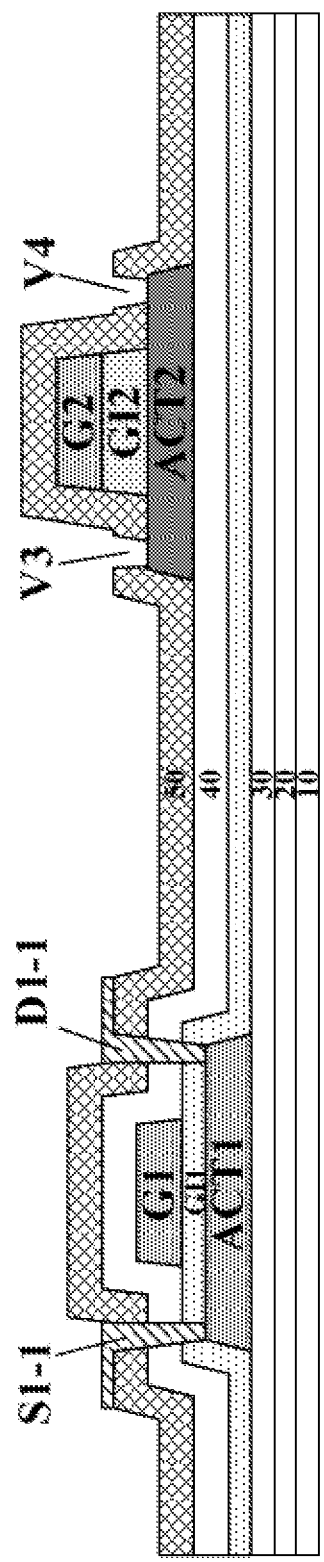
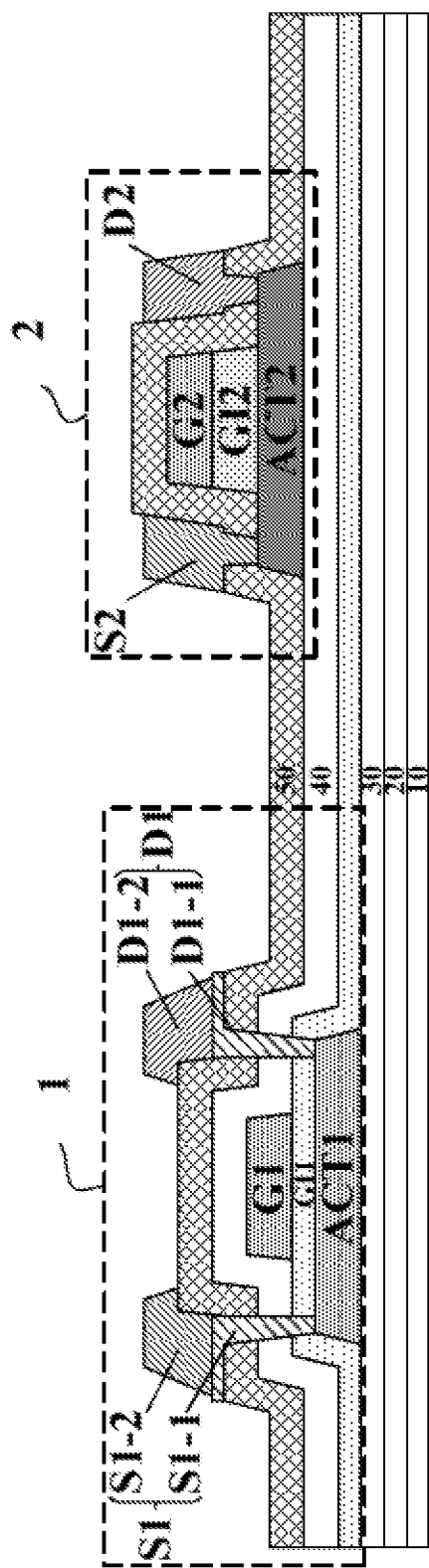
FIG. 5D
FIG. 5E

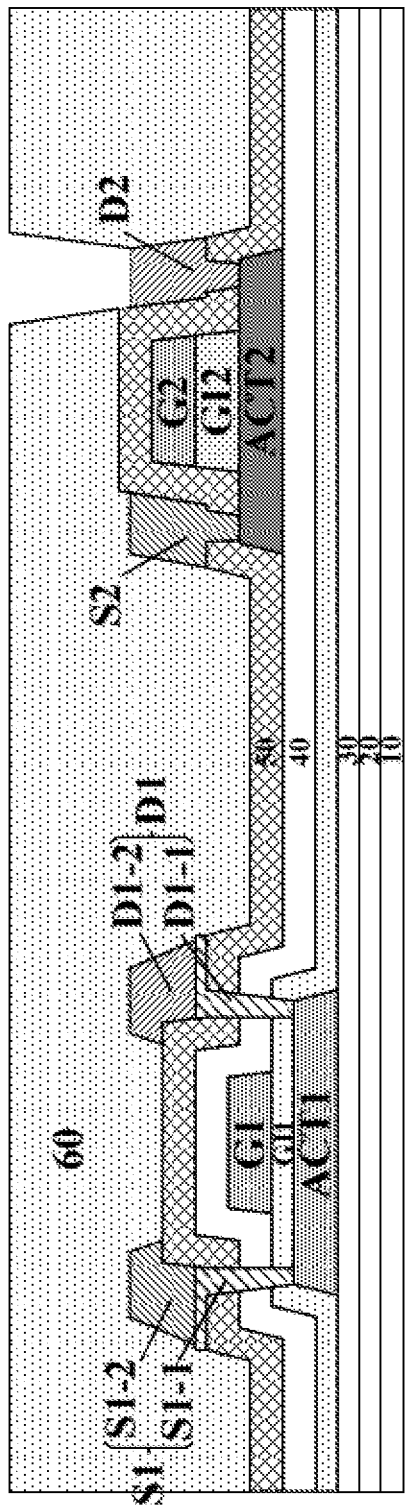
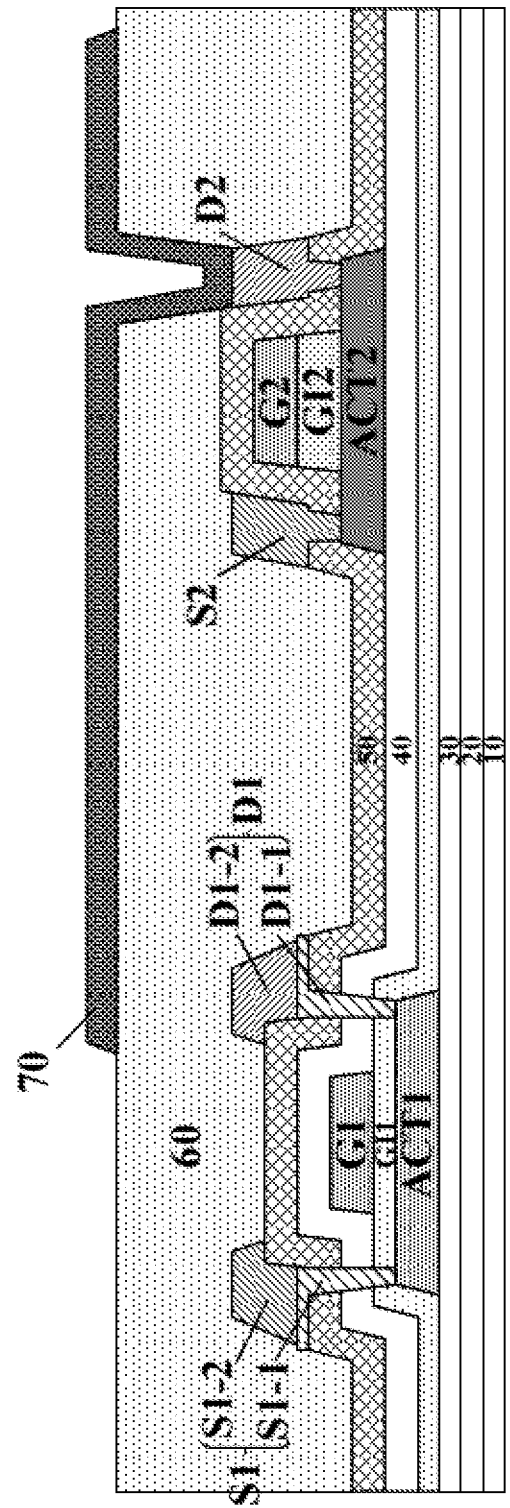
FIG. 5F
FIG. 5G

METHOD OF FABRICATING ARRAY SUBSTRATE, ARRAY SUBSTRATE, AND DISPLAY APPARATUS

CROSS-REFERENCE TO RELATED APPLICATION

This application is a national stage application under 35 U.S.C. § 371 of International Application No. PCT/CN2019/082704, filed Apr. 15, 2019, the contents of which are incorporated by reference in the entirety.

TECHNICAL FIELD

The present invention relates to display technology, more particularly, to a method of fabricating an array substrate, an array substrate, and a display apparatus.

BACKGROUND

An array substrate typically includes a plurality of subpixels in its display area, each of the plurality of subpixels is controlled by a thin film transistor for image display. Various driving circuits of the array substrate are typically disposed in a peripheral area of the array substrate. These driving circuits also include thin film transistors necessary for their operation.

SUMMARY

In one aspect, the present invention provides a method of fabricating an array substrate, comprising forming a plurality of first thin film transistors on a base substrate, a respective one of the plurality of first thin film transistors formed to comprise a first active layer, a first gate electrode, a first source electrode and a first drain electrode; and forming a plurality of second thin film transistors on the base substrate, a respective one of the plurality of second thin film transistors formed to comprise a second active layer, a second gate electrode, a second source electrode and a second drain electrode; wherein forming the first source electrode comprises forming a first source sub-layer and forming a second source sub-layer in separate patterning steps; forming the first drain electrode comprises forming a first drain sub-layer and forming a second drain sub-layer in separate patterning steps; the first source sub-layer and the first drain sub-layer are formed in a same layer using a same material in a same patterning process and using a single mask plate; and the second source sub-layer, the second drain sub-layer, the second source electrode, and the second drain electrode are formed in a same layer using a same material in a same patterning process and using a single mask plate.

Optionally, the first active layer and the second active layer are formed in different layers; an entire surface of the second active layer is protected and unexposed during a first etching process to expose a first source electrode contact region and a first drain electrode contact region of the first active layer; and an entire surface of the first active layer is protected and unexposed during a second etching process to expose a second source electrode contact region and a second drain electrode contact region of the second active layer.

Optionally, the entire surface of the first active layer is unexposed and protected in part by the first source sub-layer and the first drain sub-layer during the second etching process; and the entire surface of the second active layer is unexposed and protected by an insulating material during the first etching process.

Optionally, the first etching process is performed prior to the second etching process.

Optionally, the first active layer and the second active layer are formed as two different active layers selected from a silicon active layer and a metal oxide active layer; the silicon active layer is formed by a crystallization process converting an amorphous silicon material into a polycrystalline silicon material; and an entire surface of the metal oxide active layer is protected and unexposed during the crystallization process.

Optionally, the first active layer and the second active layer are formed in two different layers; the method further comprising forming a first inter-layer dielectric layer and forming a second inter-layer dielectric layer; the first inter-layer dielectric layer is formed between the first active layer and the second active layer; and the second inter-layer dielectric layer is formed on a side of the first active layer and the second active layer away from the base substrate.

Optionally, the method comprises forming a first via and a second via during the first etching process to expose the first source electrode contact region and the first drain electrode contact region of the first active layer; forming the first source sub-layer filling in the first via and the first drain sub-layer filling in the second via to protect the first active layer; subsequent to forming the first source sub-layer and the first drain sub-layer, forming a third via and a fourth via during the second etching process to expose the second source electrode contact region and the second drain electrode contact region of the second active layer; and forming the second source sub-layer, the second drain sub-layer, the second source electrode, and the second drain electrode in a same patterning process, the second source electrode formed to fill in the third via, the second drain electrode formed to fill in the fourth via.

Optionally, the first inter-layer dielectric layer is formed on a side of the second active layer away from the base substrate; the first active layer is formed on a side of the first inter-layer dielectric layer away from the base substrate; and the second inter-layer dielectric layer is formed on a side of the first active layer away from the base substrate.

Optionally, the method comprises forming a first via and a second via respectively extending through the second inter-layer dielectric layer during the first etching process to expose the first source electrode contact region and the first drain electrode contact region of the first active layer; forming the first source sub-layer filling in the first via and the first drain sub-layer filling in the second via to protect the first active layer; subsequent to forming the first source sub-layer and the first drain sub-layer, forming a third via and a fourth via respectively extending through the first inter-layer dielectric layer and the second inter-layer dielectric layer during the second etching process to expose the second source electrode contact region and the second drain electrode contact region of the second active layer; and forming the second source sub-layer, the second drain sub-layer, the second source electrode, and the second drain electrode in a same patterning process, the second source electrode formed to fill in the third via, the second drain electrode formed to fill in the fourth via.

Optionally, the first active layer is a metal oxide active layer and the second active layer is a silicon active layer; and subsequent to forming the first source sub-layer and the first drain sub-layer, the method further comprises performing a crystallization process to convert an amorphous silicon material into a polycrystalline silicon material, thereby forming the second active layer.

Optionally, the first inter-layer dielectric layer is formed on a side of the second active layer away from the base substrate; the first active layer is formed on a side of the first inter-layer dielectric layer away from the base substrate; and the second inter-layer dielectric layer is formed on a side of the first active layer away from the base substrate.

Optionally, the method comprises forming a first via and a second via respectively extending through the first inter-layer dielectric layer and the second inter-layer dielectric layer during the first etching process to expose the first source electrode contact region and the first drain electrode contact region of the first active layer; forming the first source sub-layer filling in the first via and the first drain sub-layer filling in the second via to protect the first active layer; subsequent to forming the first source sub-layer and the first drain sub-layer, forming a third via and a fourth via respectively extending through the second inter-layer dielectric layer during the second etching process to expose the second source electrode contact region and the second drain electrode contact region of the second active layer; and forming the second source sub-layer, the second drain sub-layer, the second source electrode, and the second drain electrode in a same patterning process, the second source electrode formed to fill in the third via, the second drain electrode formed to fill in the fourth via.

Optionally, the first active layer is a silicon active layer and the second active layer is a metal oxide active layer; and prior to forming the third via and the fourth via, the method further comprises performing a crystallization process to convert an amorphous silicon material into a polycrystalline silicon material, thereby forming the first active layer.

Optionally, the respective one of the plurality of first thin film transistors and the respective one of the plurality of second thin film transistors are formed as two different thin film transistors selected from a silicon thin film transistor and a metal oxide thin film transistor; and the metal oxide thin film transistor is formed in a display area of the array substrate, and the silicon thin film transistor is formed in a peripheral area of the array substrate.

Optionally, the respective one of the plurality of first thin film transistors and the respective one of the plurality of second thin film transistors are formed as two different thin film transistors selected from a silicon thin film transistor and a metal oxide thin film transistor; the silicon thin film transistor is formed as a drive thin film transistor electrically connected to a power supply line and an organic light emitting diode; and the metal oxide thin film transistor is formed as a switch thin film transistor electrically connected to a data line and a gate electrode of the silicon thin film transistor.

Optionally, the first active layer is the metal oxide active layer, and the second active layer is the silicon active layer.

Optionally, the first active layer is the silicon active layer, and the second active layer is the metal oxide active layer.

Optionally, the first source sub-layer and the first drain sub-layer are formed using a metallic material; and the second source sub-layer, the second drain sub-layer, the second source electrode, and the second drain electrode are formed using a metallic material.

In another aspect, the present invention provides an array substrate fabricated by the method described herein.

In another aspect, the present invention provides a display apparatus, comprising an array substrate fabricated by the method described herein, and one or more integrated circuits connected to the array substrate.

BRIEF DESCRIPTION OF THE FIGURES

The following drawings are merely examples for illustrative purposes according to various disclosed embodiments and are not intended to limit the scope of the present invention.

FIGS. 4A to 4I illustrate a method of fabricating an array substrate in some embodiments according to the present disclosure.

FIGS. 5A to 5I illustrate a method of fabricating an array substrate in some embodiments according to the present disclosure.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Low temperature polysilicon oxide technology combines advantages of low temperature polysilicon thin film transistors and metal oxide thin film transistors in an array substrate. In fabricating a low temperature polysilicon oxide array substrate, it is discovered in the present disclosure that the high temperature annealing process and the acidic etching process for forming the polysilicon thin film transistors often damage the metal oxide active layer, resulting in an inferior thin film transistor performance.

Accordingly, the present disclosure provides, inter alia, a method of fabricating an array substrate, an array substrate, and a display apparatus that substantially obviate one or more of the problems due to limitations and disadvantages of the related art. In one aspect, the present disclosure provides a method of fabricating an array substrate. In some embodiments, the method includes forming a plurality of first thin film transistors on a base substrate, a respective one of the plurality of first thin film transistors formed to include a first active layer, a first gate electrode, a first source electrode and a first drain electrode; and forming a plurality of second thin film transistors on the base substrate, a respective one of the plurality of second thin film transistors formed to include a second active layer, a second gate electrode, a second source electrode and a second drain electrode. Optionally, forming the first source electrode includes forming a first source sub-layer and forming a second source sub-layer in separate patterning steps. Optionally, forming the first drain electrode includes forming a first drain sub-layer and forming a second drain sub-layer in separate patterning steps. Optionally, the first source sub-layer and the first drain sub-layer are formed in a same layer using a same material in a same patterning process and using a single mask plate. Optionally, the second source sub-layer, the second drain sub-layer, the second source electrode, and the second drain electrode are formed in a same layer using a same material in a same patterning process and using a single mask plate. Optionally, the plurality of first thin film transistors are a plurality of top-gate type thin film transistors. Optionally, the plurality of first thin film transistors are a plurality of bottom-gate type thin film transistors. Optionally, the plurality of second thin film transistors are a plurality of top-gate type thin film transistors. Optionally, the plurality of second thin film transistors are a plurality of bottom-gate type thin film transistors.

Figure 1A:
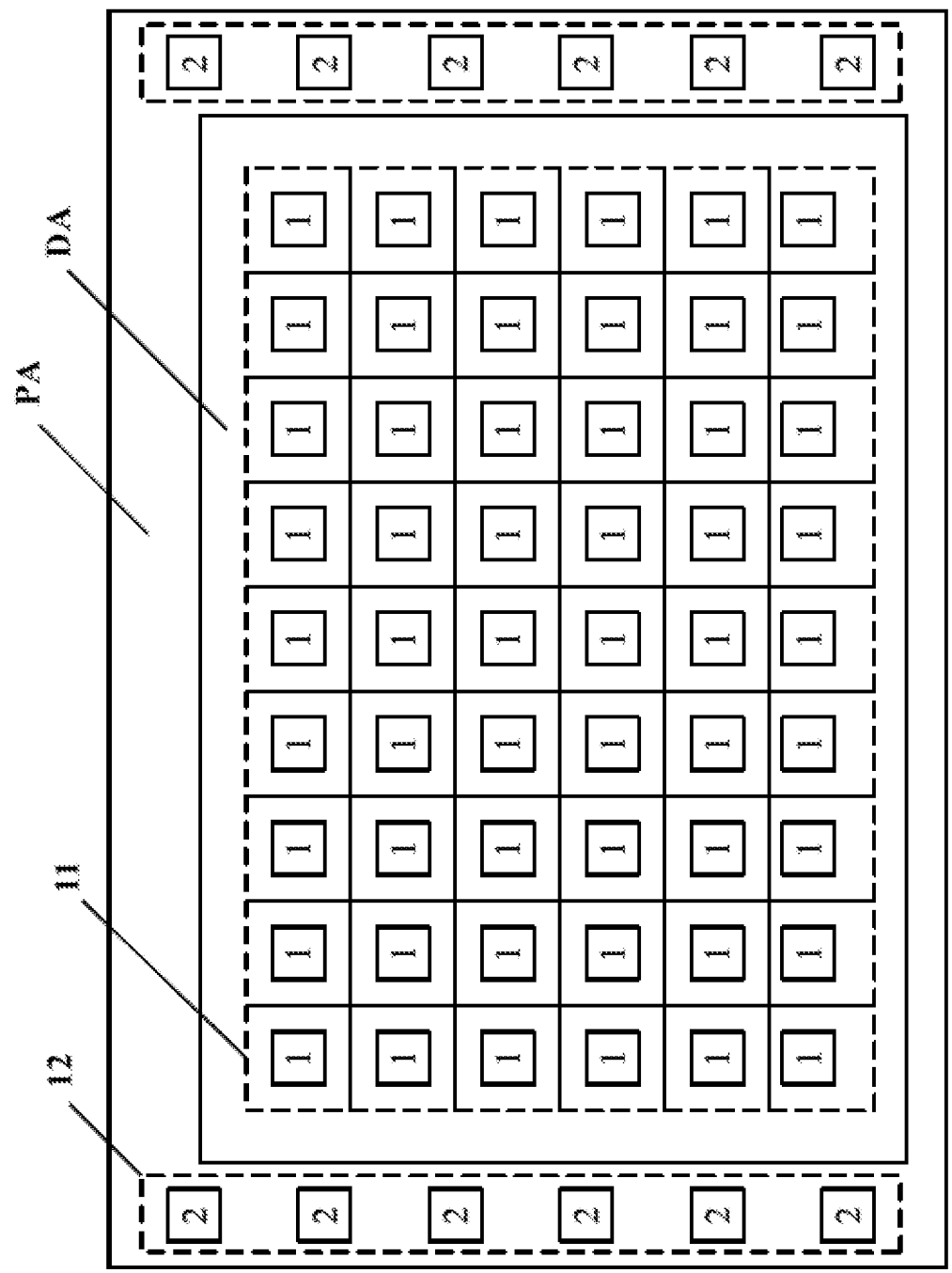
FIG. 1A is a schematic diagram illustrating the structure of an array substrate in some embodiments according to the present disclosure.

FIG. 1A is a schematic diagram illustrating the structure of an array substrate in some embodiments according to the present disclosure. Referring to FIG. 1A, the array substrate in some embodiments includes a plurality of first thin film transistors 1 and a plurality of second thin film transistors 2. The array substrate is formed to have a display area DA and a peripheral area PA. Optionally, the plurality of first thin film transistors 1 are in the display area DA, and the plurality of second thin film transistors 2 are in the peripheral area PA. Optionally, the array substrate includes an array of a matrix of a plurality of subpixels 11, and a respective one of the plurality of first thin film transistors 1 is in one of the plurality of subpixels 11, as shown in FIG. 1A. Optionally, the array substrate includes a display driver circuitry 12, and the display driver circuitry 12 includes the plurality of second thin film transistors 2. Optionally, the display driver circuitry 12 is a gate-on-array circuit for driving a plurality of gate lines in the array substrate. Optionally, the display driver circuitry 12 is a demultiplexer circuit. Optionally, the array substrate is a liquid crystal array substrate.

Optionally, a respective one of the plurality of first thin film transistors 1 is a thin film transistor having a metal oxide active layer. Optionally, a respective one of the plurality of second thin film transistors 2 is a thin film transistor having a polycrystalline silicon active layer.

Optionally, a respective one of the plurality of first thin film transistors 1 is a thin film transistor having a polycrystalline silicon active layer. Optionally, a respective one of the plurality of second thin film transistors 2 is a thin film transistor having a metal oxide active layer.

As used herein, the term "peripheral area" refers to an area where various circuits and wires are provided to transmit signals to the array substrate. To increase the transparency of the display apparatus, non-transparent or opaque components of the display apparatus (e.g., battery, printed circuit board, metal frame), can be disposed in the peripheral area rather than in the display areas. As used herein, the term "display area" refers to an area of the array substrate where image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting diode display. An inter-subpixel region refers to a region between adjacent subpixel regions, such as a region corresponding to a black matrix in a liquid crystal display or a region corresponding a pixel definition layer in an organic light emitting diode display. Optionally, the inter-subpixel region is a region between adjacent subpixel regions in a same pixel. Optionally, the inter-subpixel region is a region between two adjacent subpixel regions from two adjacent pixels.

Figure 1B:
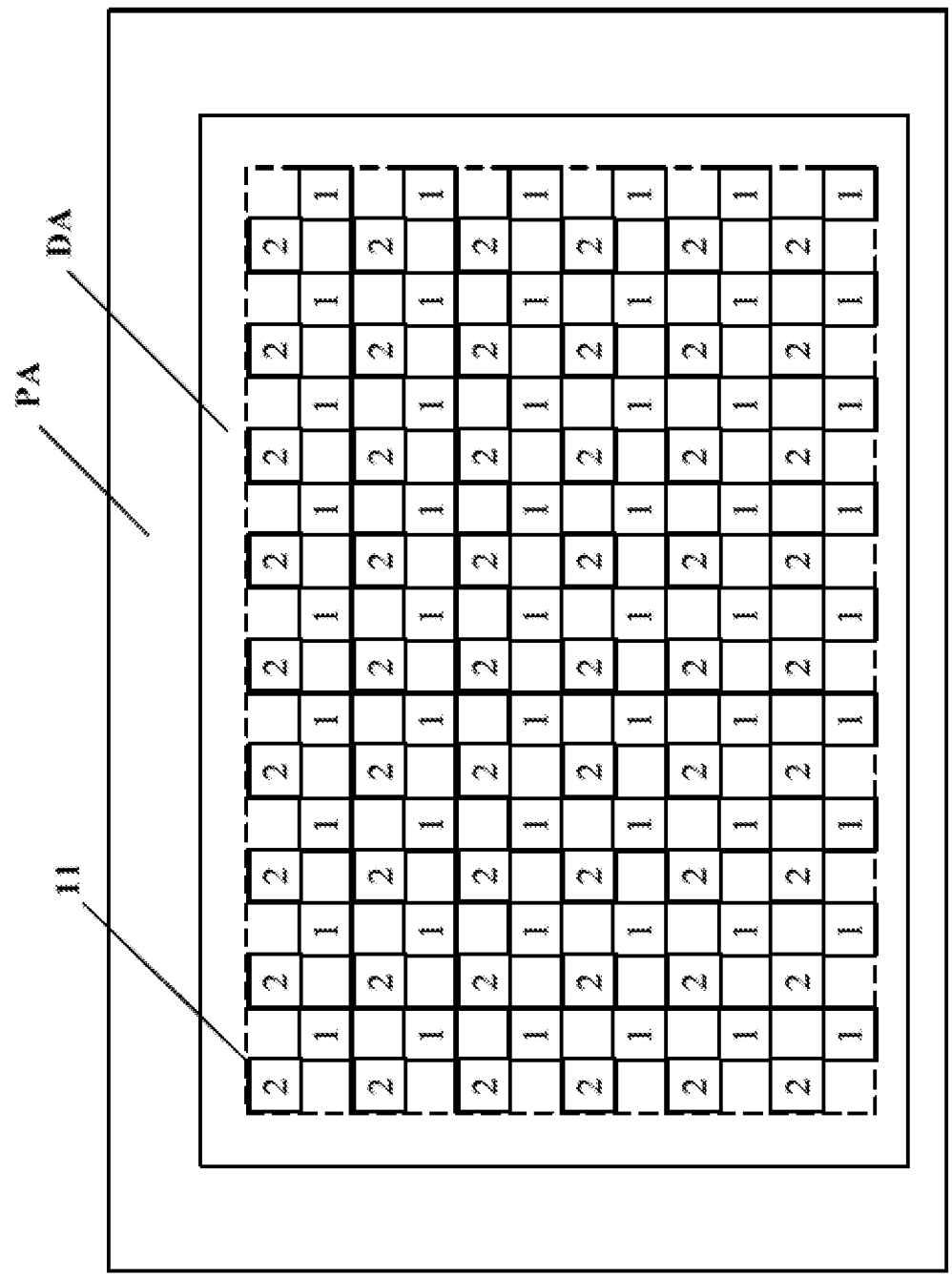
FIG. 1B is a schematic diagram illustrating the structure of an array substrate in some embodiments according to the present disclosure.

In some embodiments, the display area of the array substrate includes both a plurality of first thin film transistors and a plurality of second thin film transistors. FIG. 1B is a schematic diagram illustrating the structure of an array substrate in some embodiments according to the present disclosure. Referring to FIG. 1B, the array substrate in some embodiments includes a plurality of first thin film transistors 1 and a plurality of second thin film transistors 2, both of which in the display area DA. In one example, the array substrate includes an array of a matrix of a plurality of subpixels 11, a respective one of which includes at least one of the plurality of first thin film transistors 1 and at least one of the plurality of second thin film transistors 2. Optionally, the array substrate is an organic light emitting diode array substrate.

Optionally, a respective one of the plurality of first thin film transistors 1 is a thin film transistor having a metal oxide active layer. Optionally, a respective one of the plurality of second thin film transistors 2 is a thin film transistor having a polycrystalline silicon active layer.

Optionally, a respective one of the plurality of first thin film transistors 1 is a thin film transistor having a polycrystalline silicon active layer. Optionally, a respective one of the plurality of second thin film transistors 2 is a thin film transistor having a metal oxide active layer.

Optionally, the plurality of first thin film transistors 1 are drive thin film transistors (e.g., transistors connected to the power supply line and to the light emitting diode) in an organic light emitting diode array substrate. Optionally, the plurality of second thin film transistors 2 are switch thin film transistors (e.g., transistors connected to data lines and the gate electrode of the drive transistors, i.e., address selection thin film transistors) in an organic light emitting diode array substrate.

Optionally, the plurality of first thin film transistors 1 are switch thin film transistors (e.g., transistors connected to data lines and the gate electrode of the drive transistors, i.e., address selection thin film transistors) in an organic light emitting diode array substrate. Optionally, the plurality of second thin film transistors 2 are drive thin film transistors (e.g., transistors connected to the power supply line and to the light emitting diode) in an organic light emitting diode array substrate.

Figure 1C:
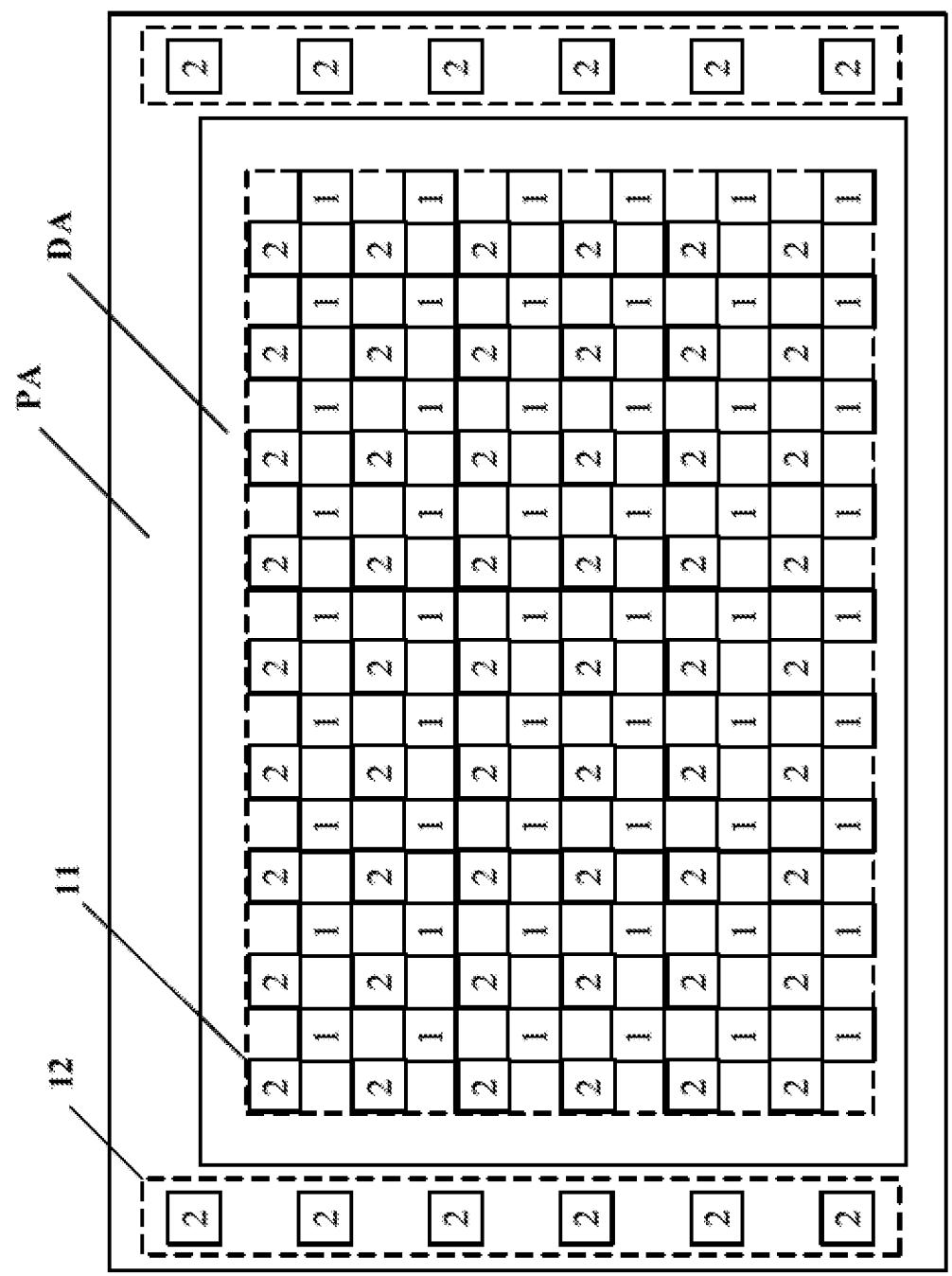
FIG. 1C is a schematic diagram illustrating the structure of an array substrate in some embodiments according to the present disclosure.

In some embodiments, the plurality of first thin film transistors are in the display area, and the plurality of second thin film transistors are in the display area and the peripheral area. FIG. 1C is a schematic diagram illustrating the structure of an array substrate in some embodiments according to the present disclosure. Referring to FIG. 1C, the array substrate in some embodiments includes a plurality of first thin film transistors 1 and a plurality of second thin film transistors 2. The peripheral area PA includes multiple second thin film transistors of the plurality of second thin film transistors 2. The display area DA includes the plurality of first thin film transistors 1 and multiple second thin film transistors of the plurality of second thin film transistors 2. In one example, the array substrate is an organic light emitting diode array substrate. Optionally, the multiple second thin film transistors 2 in the peripheral area PA are thin film transistors in the display driver circuitry 12, which is disposed in the peripheral area PA.

Optionally, the plurality of first thin film transistors 1 are drive thin film transistors (e.g., transistors connected to the power supply line and to the light emitting diode) in an organic light emitting diode array substrate. Optionally, the multiple second thin film transistors 2 in the display area DA are switch thin film transistors (e.g., transistors connected to data lines and the gate electrode of the drive transistors, i.e., address selection thin film transistors) in an organic light emitting diode array substrate.

Optionally, the plurality of first thin film transistors 1 are switch thin film transistors (e.g., transistors connected to data lines and the gate electrode of the drive transistors, i.e., address selection thin film transistors) in an organic light emitting diode array substrate. Optionally, the multiple second thin film transistors 2 in the display area DA are drive thin film transistors (e.g., transistors connected to the power supply line and to the light emitting diode) in an organic light emitting diode array substrate.

Figure 2A:
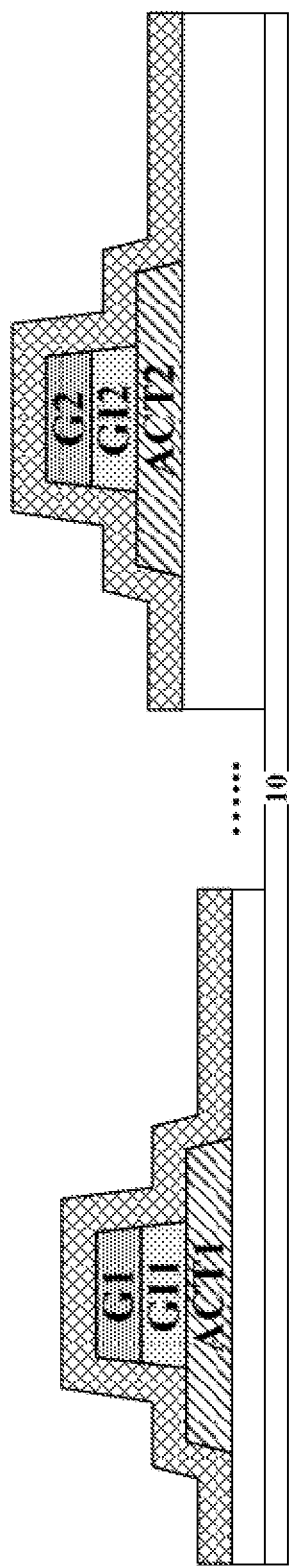
FIGS. 2A to 2E illustrate a method of fabricating an array substrate in some embodiments according to the present disclosure.
Figure 2B:
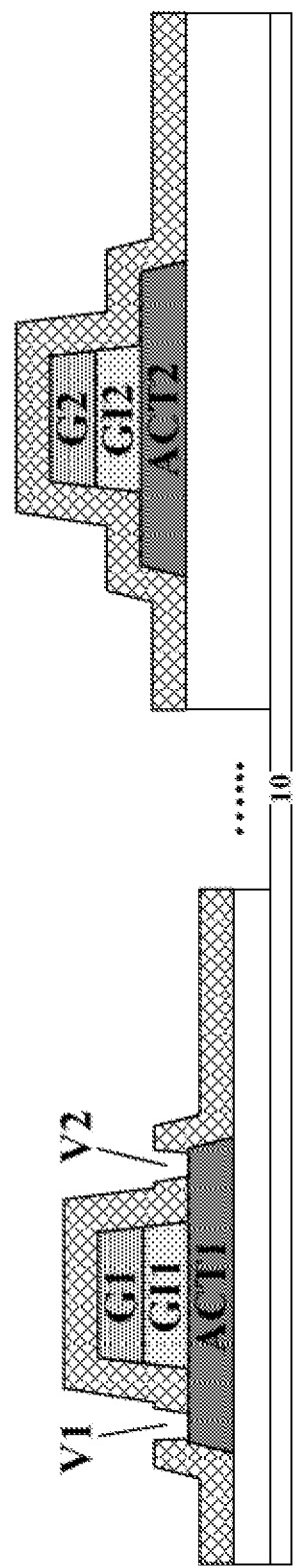
Figure 2C:
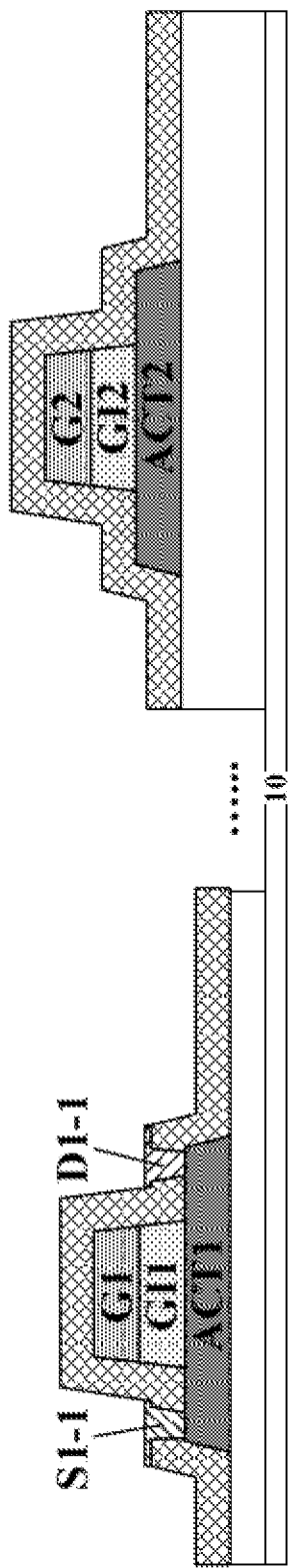
Figure 2D:
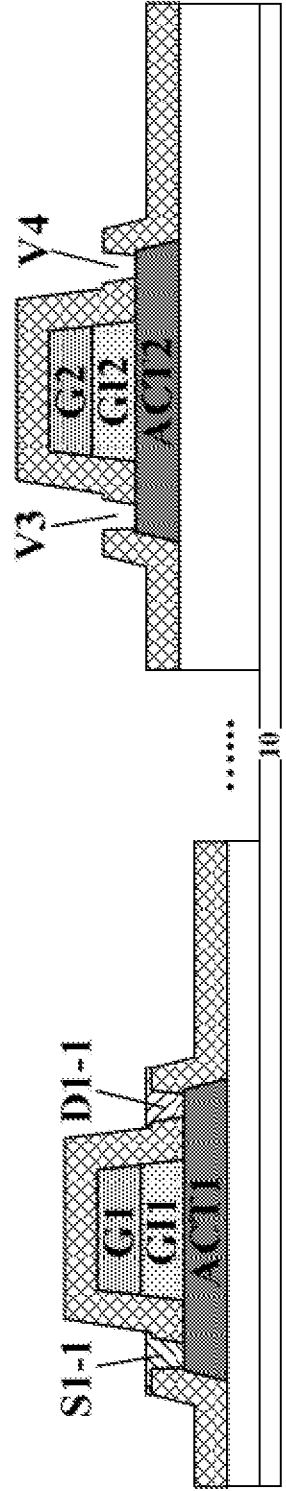
Figure 2E:
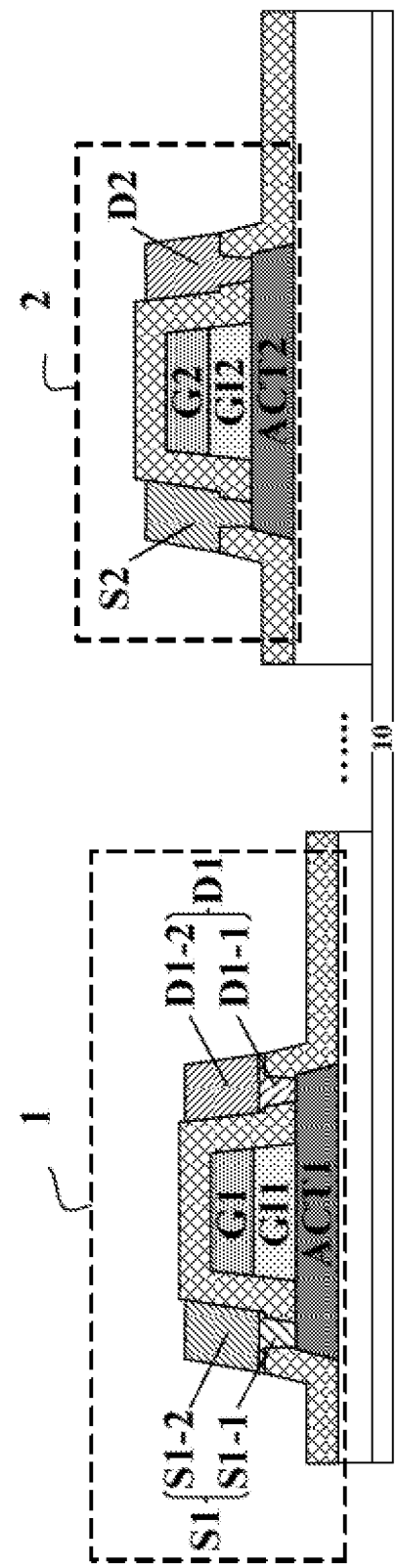

FIGS. 2A to 2E illustrate a method of fabricating an array substrate in some embodiments according to the present disclosure. Referring to FIG. 2E, the method includes forming a plurality of first thin film transistors 1 on a base substrate 10, and forming a plurality of second thin film transistors 2 on the base substrate 10. A respective one of the plurality of first thin film transistors 1 is formed to include a first active layer ACT1, a first gate electrode G1, a first source electrode S1, and a first drain electrode D1. A respective one of the plurality of second thin film transistors 2 is formed to include a second active layer ACT2, a second gate electrode G2, a second source electrode S2 and a second drain electrode D2. A first gate insulating layer GI1 is formed between the first gate electrode G1 and the first active layer ACT1. A second gate insulating layer GI2 is formed between the second gate electrode G2 and the second active layer ACT2. Optionally, the first active layer ACT1 and the second active layer ACT2 are formed in different layers. Optionally, the first gate insulating layer GI1 and the second gate insulating layer GI2 are formed as two different insulating layers. Optionally, the first gate electrode G1 and the second gate electrode G2 are formed in different layers.

In some embodiments, the step of forming the first source electrode S1 includes forming a first source sub-layer S1-1 and forming a second source sub-layer S1-2 in separate patterning steps, and the step of forming the first drain electrode D1 includes forming a first drain sub-layer D1-1 and forming a second drain sub-layer D1-2 in separate patterning steps, as illustrated in FIGS. 2A to 2E. Optionally, the first source sub-layer S1-1 and the first drain sub-layer D1-1 are formed in a same layer using a same material in a same patterning process and using a single mask plate. Optionally, the second source sub-layer S1-2, the second drain sub-layer D1-2, the second source electrode S2, and the second drain electrode D2 are formed in a same layer using a same material in a same patterning process and using a single mask plate.

As used herein, the term "same layer" refers to the relationship between the layers simultaneously formed in the same step. In one example, the first source sub-layer S1-1 and the first drain sub-layer D1-1 are in a same layer when they are formed as a result of one or more steps of a same patterning process performed in a same layer of material. In another example, the first source sub-layer S1-1 and the first drain sub-layer D1-1 can be formed in a same layer by simultaneously performing the step of forming the first source sub-layer S1-1 and the step of forming the first drain sub-layer D1-1. The term "same layer" does not always mean that the thickness of the layer or the height of the layer in a cross-sectional view is the same.

Referring to FIG. 2A, top-gate type thin film transistors are depicted to illustrate the method. Specifically, a first active layer ACT1 is formed on a base substrate 10, a first gate insulating layer GI1 is formed on a side of the first active layer ACT1 away from the base substrate 10, and a first gate electrode G1 is formed on a side of the first gate insulating layer GI1 away from the first active layer ACT1. A second active layer ACT2 is formed on a base substrate 10, a second gate insulating layer GI2 is formed on a side of the second active layer ACT2 away from the base substrate 10, and a second gate electrode G2 is formed on a side of the second gate insulating layer GI2 away from the second active layer ACT2. Optionally, the first active layer ACT1 and the second active layer ACT2 are formed in different layers.

Referring to FIG. 2B, a first etching process is performed to expose a first source electrode contact region and a first drain electrode contact region of the first active layer ACT1. Specifically, a first via V1 and a second via V2 respectively corresponding to a first source electrode contact region and a first drain electrode contact region of the first active layer ACT1 are formed to expose the first source electrode contact region and the first drain electrode contact region of the first active layer ACT1. During the first etching process, an entire surface of the second active layer ACT2 is protected and unexposed, e.g., by an insulating material. Because the second active layer ACT2 is protected and unexposed during the first etching process, the second active layer ACT2 is not exposed to the etchant (e.g., an acidic etchant) used in the first etching process. Accordingly, the issue of damages caused by the etchant on the second active layer ACT2 can be obviated, resulting in a more stable active layer and enhanced performance of the thin film transistor, particularly when the second active layer ACT2 is made of a metal oxide material.

Referring to FIG. 2C, a first source sub-layer S1-1 is formed to fill in the first via V1 and a first drain sub-layer D1-1 is formed to fill in the second via V2. Optionally, the first source sub-layer S1-1 is formed to be in direct contact with the first source electrode contact region of the first active layer ACT1, and the first drain sub-layer D1-1 is formed to be in direct contact with the first drain electrode contact region of the first active layer ACT1 to protect the first active layer ACT1.

Referring to FIG. 2D, subsequent to forming the first source sub-layer S1-1 and the first drain sub-layer D1-1, a second etching process is then performed to expose a second source electrode contact region and a second drain electrode contact region of the second active layer ACT2. Specifically, a third via V3 and a fourth via V4 respectively corresponding to a second source electrode contact region and a second drain electrode contact region of the second active layer ACT2 are formed to expose the second source electrode contact region and the second drain electrode contact region of the second active layer ACT2. During the second etching process, an entire surface of the first active layer ACT1 is protected and unexposed, e.g., in part by the first source sub-layer S1-1 and the first drain sub-layer D1-1. Because the first active layer ACT1 is protected and unexposed during the second etching process, the first active layer ACT1 is not exposed to the etchant (e.g., an acidic etchant) used in the second etching process. Accordingly, the issue of damages caused by the etchant on the first active layer ACT1 can be obviated, resulting in a more stable active layer and enhanced performance of the thin film transistor, particularly when the first active layer ACT1 is made of a metal oxide material.

Referring to FIG. 2E, subsequent to forming the third via V3 and the fourth via V4, a second source sub-layer S1-2, a second drain sub-layer D1-2, a second source electrode S2, and a second drain electrode D2 are formed in a same layer and in a same patterning process. The second source sub-layer S1-2 is formed on a side of the first source sub-layer S1-1 away from the base substrate 10 and optionally formed to be in direct contact with the first source sub-layer S1-1. The second drain sub-layer D1-2 is formed on a side of the first drain sub-layer D1-1 away from the base substrate 10 and optionally formed to be in direct contact with the first drain sub-layer D1-1. The second source electrode S2 is formed to fill in the third via V3, the second drain electrode D2 is formed to fill in the fourth via V4.

In some embodiments, the first active layer ACT1 and the second active layer ACT2 are formed as two different active layers selected from a silicon active layer and a metal oxide active layer. Optionally, the silicon active layer is formed by a crystallization process converting an amorphous silicon material into a polycrystalline silicon material. Optionally, an entire surface of the metal oxide active layer is protected and unexposed during the crystallization process. Because the crystallization process typically involves a high temperature annealing process, which would adversely affect the stability of the metal oxide active layer and performance of the thin film transistor fabricated, if a surface of the metal oxide active layer is exposed during the crystallization process.

In one example, the first active layer ACT1 is formed as a metal oxide active layer, and the second active layer ACT2 is formed as a silicon active layer. The crystallization process for forming the second active layer ACT2 may be performed, for example, in steps illustrated in FIG. 2A or FIG. 2C, but not in the step illustrated in FIG. 2B (when the surface of the first active layer ACT1 is partially exposed).

In one example, the second active layer ACT2 is formed as a metal oxide active layer, and the first active layer ACT1 is formed as a silicon active layer. The crystallization process for forming the second active layer ACT2 may be performed, for example, in steps illustrated in FIGS. 2A to 2C, but not in the step illustrated in FIG. 2D (when the surface of the second active layer ACT2 is partially exposed).

Figure 3A:
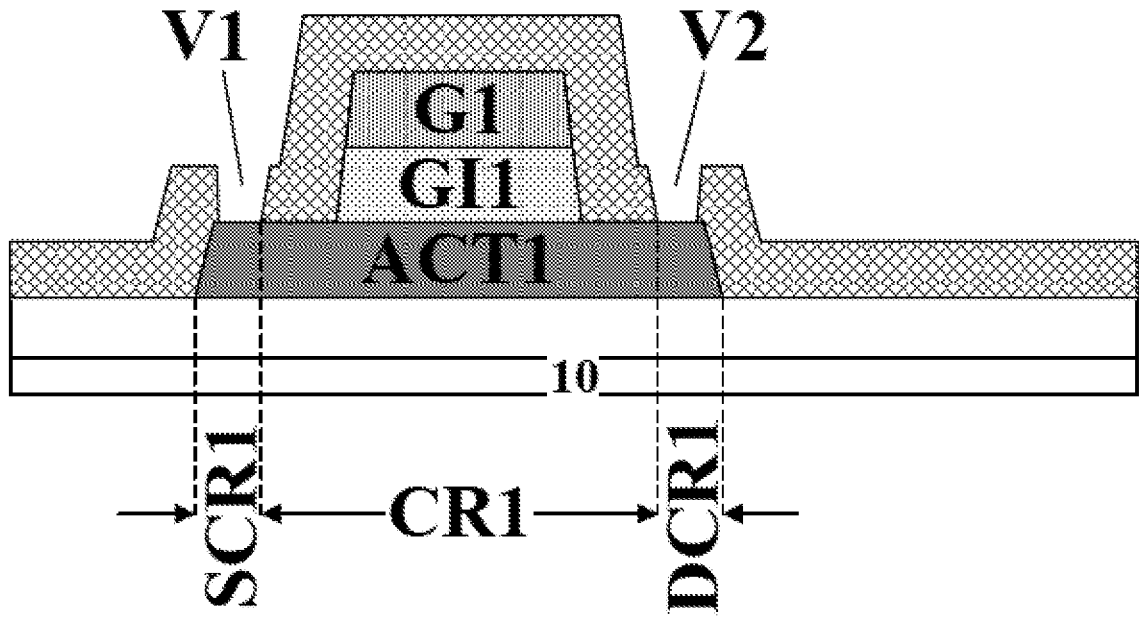
FIG. 3A illustrates regions of a first active layer in some embodiments according to the present disclosure.

FIG. 3A illustrates regions of a first active layer in some embodiments according to the present disclosure. Referring to FIG. 3A, a first via V1 and a second via V2 respectively corresponding to a first source electrode contact region SCR1 and a first drain electrode contact region DCR1 of the first active layer ACT1 are formed to expose the first source electrode contact region SCR1 and the first drain electrode contact region DCR1 of the first active layer ACT1. A first channel region CR1 of the first active layer ACT1 is between the first source electrode contact region SCR1 and the first drain electrode contact region DCR1.

Figure 3B:
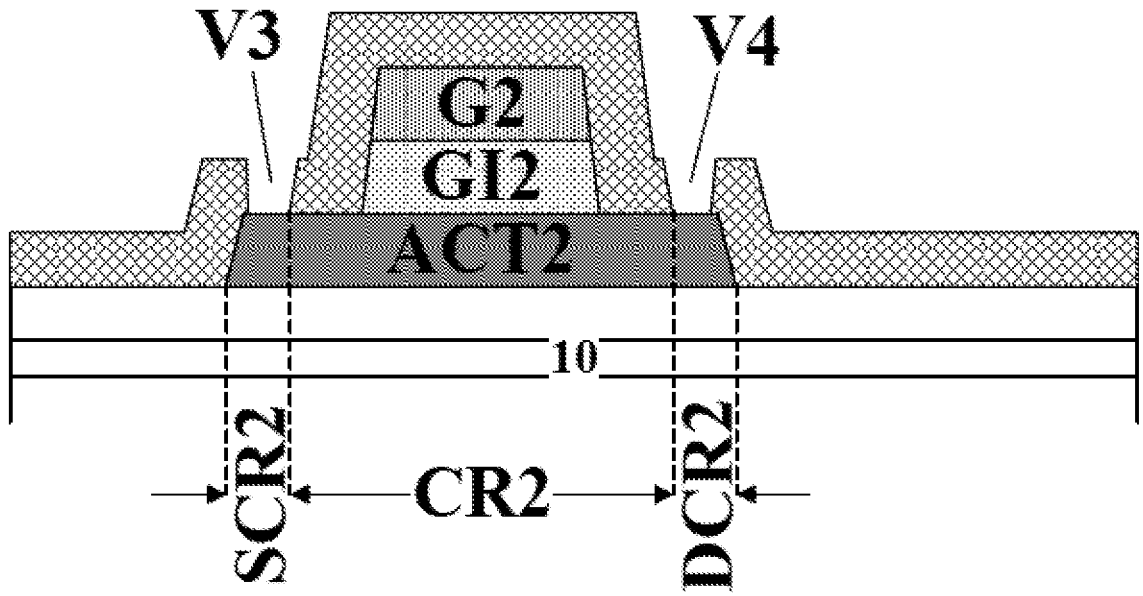
FIG. 3B illustrates regions of a second active layer in some embodiments according to the present disclosure.

FIG. 3B illustrates regions of a second active layer in some embodiments according to the present disclosure. Referring to FIG. 3B, a third via V3 and a fourth via V4 respectively corresponding to a second source electrode contact region SCR2 and a second drain electrode contact region DCR2 of the second active layer ACT2 are formed to expose the second source electrode contact region SCR2 and the second drain electrode contact region DCR2 of the second active layer ACT2. A second channel region CR2 of the second active layer ACT2 is between the second source electrode contact region SCR2 and the second drain electrode contact region DCR2.

FIGS. 4A to 4I illustrate a method of fabricating an array substrate in some embodiments according to the present disclosure. FIGS. 5A to 5I illustrate a method of fabricating an array substrate in some embodiments according to the present disclosure. Referring to FIGS. 4A to 4I and 5A to 5I, the array substrate is fabricated on a base substrate 10 (e.g., a glass plate), a flexible base substrate 20 (e.g., a polyimide substrate) on the base substrate 10, and a buffer layer 30 on a side of the flexible base substrate 20 away from the base substrate 10. In FIGS. 4A to 4I, the first active layer ACT1 is on a side of the second active layer ACT2 away from the base substrate 10. In FIGS. 5A to 5I, the second active layer ACT2 is on a side of the first active layer ACT1 away from the base substrate 10. Optionally, the plurality of first thin film transistors 1 are metal oxide thin film transistors. Optionally, the plurality of first thin film transistors 1 are polycrystalline silicon thin film transistors. Optionally, the plurality of second thin film transistors 2 are metal oxide thin film transistors. Optionally, the plurality of second thin film transistors 2 are polycrystalline silicon thin film transistors.

Optionally, the plurality of first thin film transistors 1 are in the display area, and the plurality of second thin film transistors 2 are in the peripheral area. Optionally, the plurality of first thin film transistors 1 are in the peripheral area, and the plurality of second thin film transistors 2 are in the display area.

Optionally, the plurality of first thin film transistors 1 are drive thin film transistors (e.g., transistors connected to the power supply line and to the light emitting diode) in an organic light emitting diode array substrate. Optionally, the plurality of second thin film transistors 2 are switch thin film transistors (e.g., transistors connected to data lines and the gate electrode of the drive transistors, i.e., address selection thin film transistors) in an organic light emitting diode array substrate. Optionally, the plurality of first thin film transistors 1 are switch thin film transistors (e.g., transistors connected to data lines and the gate electrode of the drive transistors, i.e., address selection thin film transistors) in an organic light emitting diode array substrate. Optionally, the plurality of second thin film transistors 2 are drive thin film transistors (e.g., transistors connected to the power supply line and to the light emitting diode) in an organic light emitting diode array substrate.

In some embodiments, the first active layer ACT1 and the second active layer ACT2 are formed in two different layers. In some embodiments, the method further includes forming a first inter-layer dielectric layer 40 and forming a second inter-layer dielectric layer 50. The first inter-layer dielectric layer 40 is formed between the first active layer ACT1 and the second active layer ACT2. The second inter-layer dielectric layer 50 is formed on a side of the first active layer ACT1 and the second active layer ACT2 away from the base substrate 10.

Referring to FIG. 4A, a second active layer ACT2 is formed on the base substrate 10, a second gate insulating layer GI2 is formed on a side of the second active layer ACT2 away from the base substrate 10, a second gate electrode G2 is formed on a side of the second gate insulating layer GI2 away from the second active layer ACT2, a first inter-layer dielectric layer 40 is formed on side of the second electrode G2 away from the base substrate 10, a first active layer ACT1 is formed on a side of the first inter-layer dielectric layer 40 away from the base substrate 10, a first gate insulating layer GI1 is formed on a side of the first active layer ACT1 away from the base substrate 10, a first gate electrode G1 is formed on a side of the first gate insulating layer GI1 away from the base substrate 10, and a second inter-layer dielectric layer 50 is formed on a side of the first gate electrode G1 away from the base substrate 10. The first inter-layer dielectric layer 40 is formed on a side of the second active layer ACT2 away from the base substrate 10, the first active layer ACT1 is formed on a side of the first inter-layer dielectric layer 40 away from the base substrate 10, and the second inter-layer dielectric layer 50 is formed on a side of the first active layer ACT1 away from the base substrate 10.

Referring to FIG. 4B, a first via V1 and a second via V2 are formed to respectively extend through the second inter-layer dielectric layer 50 during a first etching process to expose the first source electrode contact region and the first drain electrode contact region of the first active layer ACT1.

Referring to FIG. 4C, a first source sub-layer S1-1 is formed to fill in the first via V1 and a first drain sub-layer D1-1 is formed to fill in the second via V2 to protect the first active layer ACT1, e.g., to cover up exposed surface of the first active layer ACT1.

Figure 4D:
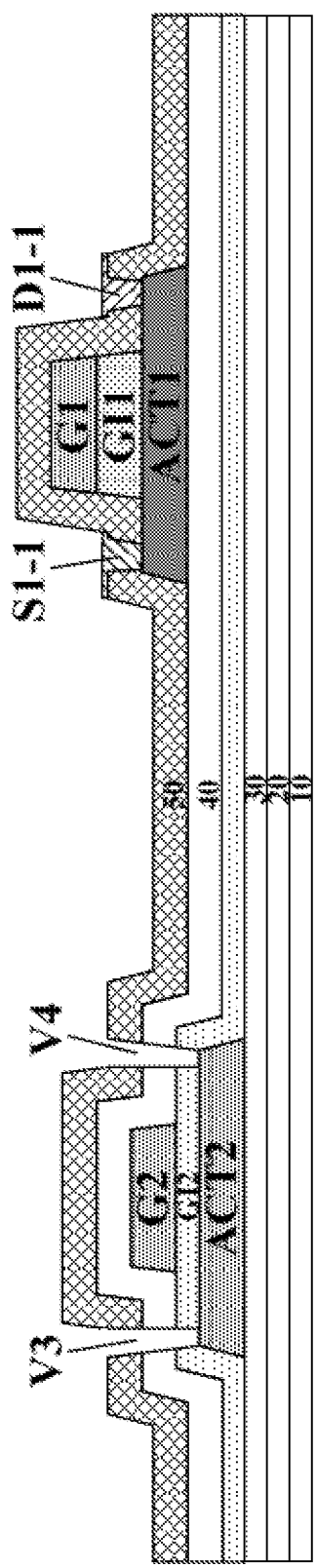

Referring to FIG. 4D, subsequent to forming the first source sub-layer S1-1 and the first drain sub-layer D1-1, a third via V3 and a fourth via V4 are formed to respectively extend through the first inter-layer dielectric layer 40, the second gate insulating layer GI2, and the second inter-layer dielectric layer 50 during a second etching process to expose the second source electrode contact region and the second drain electrode contact region of the second active layer ACT2.

Figure 4E:
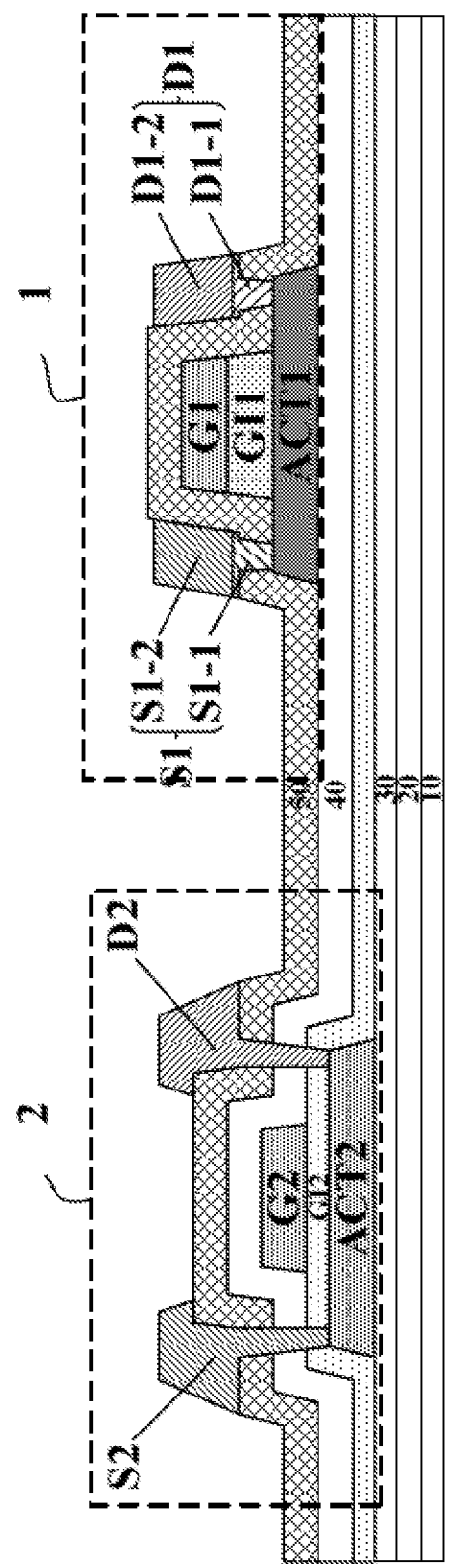

Referring to FIG. 4E, a second source sub-layer S1-2, a second drain sub-layer D1-2, a second source electrode S2, and a second drain electrode D2 are formed in a same patterning process and optionally using a same material and a single mask plate. The second source electrode S2 is formed to fill in the third via V3, the second drain electrode D2 is formed to fill in the fourth via V4. The second source sub-layer S1-2 is formed on a side of the first source sub-layer S1-1 and electrically connected to the first source sub-layer S1-1. The second drain sub-layer D1-2 is formed on a side of the first drain sub-layer D1-1 and electrically connected to the first drain sub-layer D1-1.

In some embodiments, the first active layer ACT1 is a metal oxide active layer and the second active layer ACT2 is a silicon active layer. Optionally, subsequent to forming the first source sub-layer S1-1 and the first drain sub-layer D1-1, the method further includes performing a crystallization process to convert an amorphous silicon material into a polycrystalline silicon material, thereby forming the second active layer ACT2, while the first active layer ACT1 is protected in part by the first source sub-layer S1-1 and the first drain sub-layer D1-1.

Optionally, the first source sub-layer S1-1 and the first drain sub-layer D1-1 are formed using a metallic material; and the second source sub-layer S1-2, the second drain sub-layer D1-2, the second source electrode S2, and the second drain electrode D2 are formed using a metallic material. Optionally, the first source sub-layer S1-1, the first drain sub-layer D1-1, the second source sub-layer S1-2, the second drain sub-layer D1-2, the second source electrode S2, and the second drain electrode D2 are formed using a same metallic material.

Figure 4F:
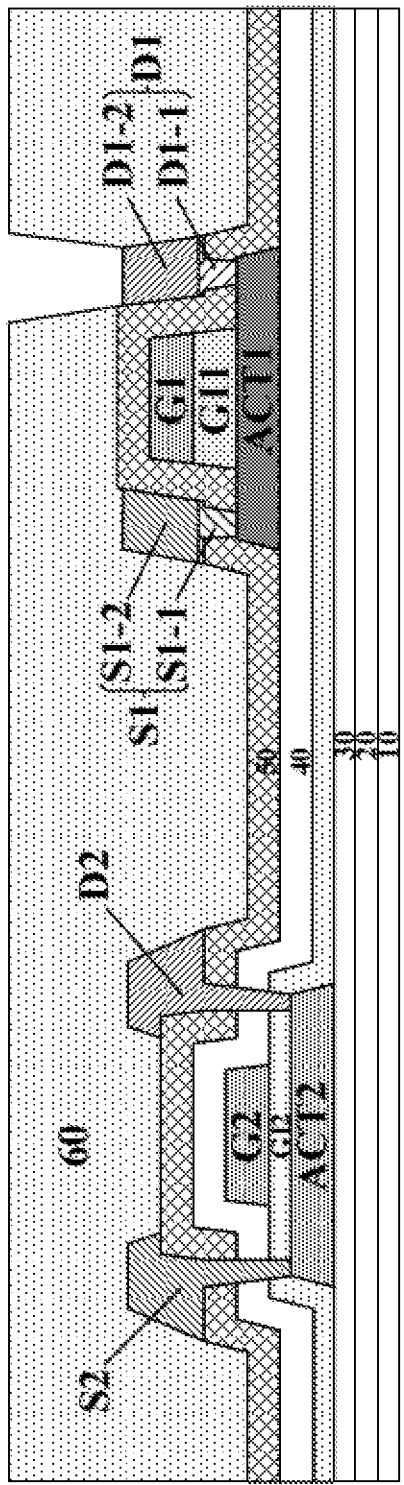

Referring to FIG. 4F, a planarization layer 60 is formed on a side of the first source electrode S1, the first drain electrode D1, the second source electrode S2, and the second drain electrode D2 away from the base substrate 10. A via is formed to extending through the planarization layer 60 to expose a surface of the first drain electrode D1.

Figure 4G:
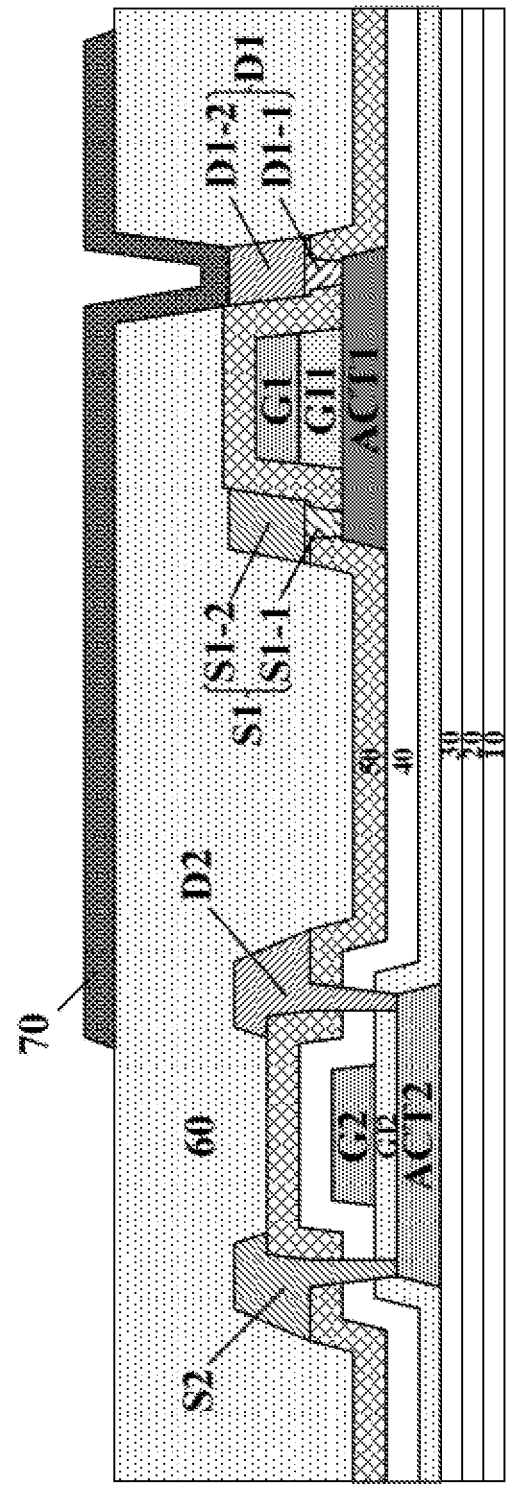

Referring to FIG. 4G, a pixel electrode 70 is formed on a side of the planarization layer 60 away from the base substrate 10. The pixel electrode 70 is formed to be electrically connected to the first drain electrode D1 through the via extending through the planarization layer 60.

Figure 4H:
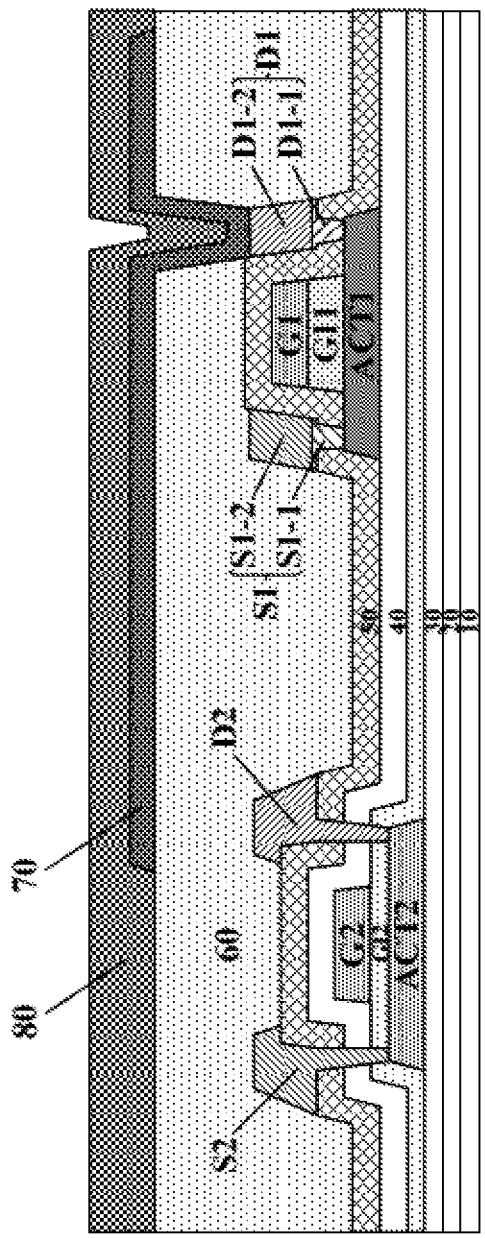

Referring to FIG. 4H, an insulating layer 80 is formed on a side of the pixel electrode 70 away from the base substrate 10.

Figure 4I:
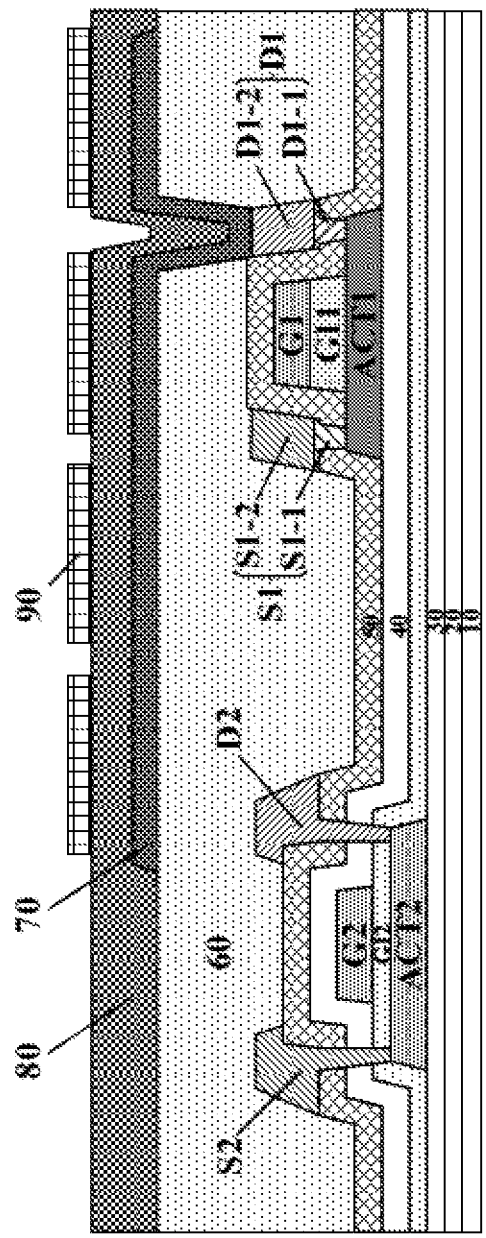

Referring to FIG. 4I, a common electrode 90 is formed on a side of the insulating layer 80 away from the base substrate 10.

Figure 5A:
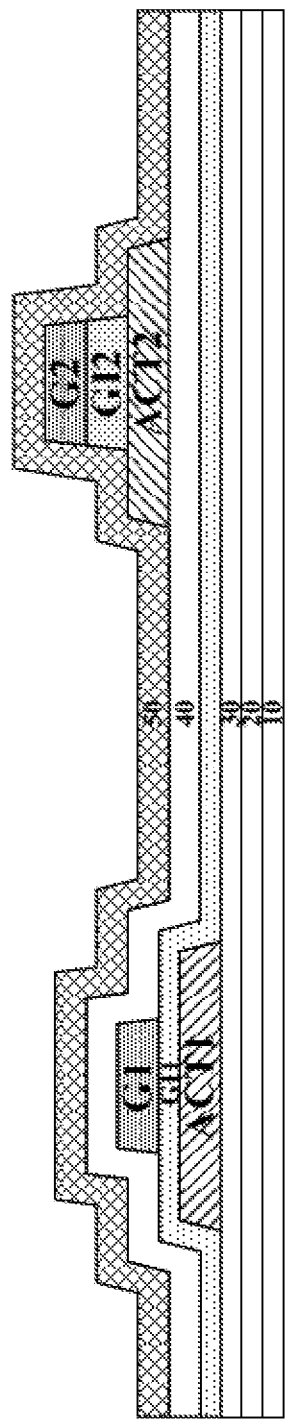

Referring to FIG. 5A, a first active layer ACT1 is formed on the base substrate 10, a first gate insulating layer GI1 is formed on a side of the first active layer ACT1 away from the base substrate 10, a first gate electrode G1 is formed on a side of the first gate insulating layer GI1 away from the first active layer ACT1, a first inter-layer dielectric layer 40 is formed on side of the first electrode G1 away from the base substrate 10, a second active layer ACT2 is formed on a side of the first inter-layer dielectric layer 40 away from the base substrate 10, a second gate insulating layer GI2 is formed on a side of the second active layer ACT2 away from the base substrate 10, a second gate electrode G2 is formed on a side of the second gate insulating layer GI2 away from the base substrate 10, and a second inter-layer dielectric layer 50 is formed on a side of the second gate electrode G2 away from the base substrate 10. The first inter-layer dielectric layer 40 is formed on a side of the first active layer ACT1 away from the base substrate 10, the second active layer ACT2 is formed on a side of the first inter-layer dielectric layer 40 away from the base substrate 10, and the second inter-layer dielectric layer 50 is formed on a side of the second active layer ACT2 away from the base substrate 10.

Figure 5B:
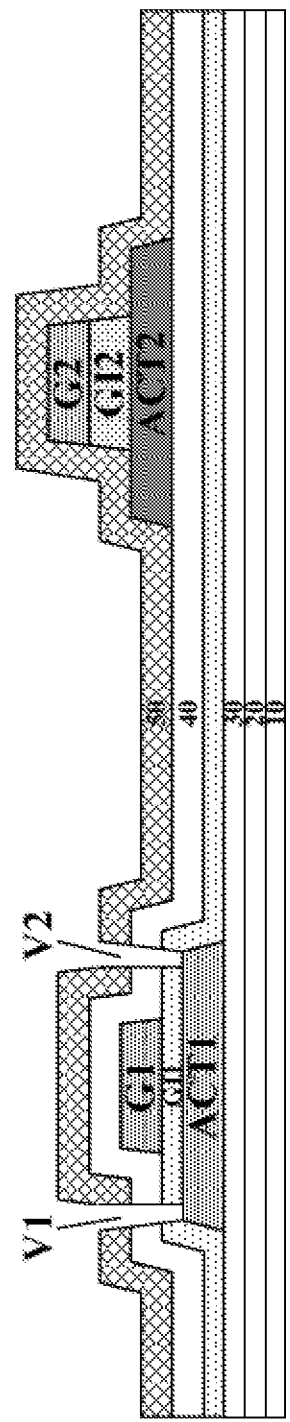

Referring to FIG. 5B, a first via V1 and a second via V2 are formed to respectively extend through the first inter-layer dielectric layer 40, the first gate insulating layer GI1, and the second inter-layer dielectric layer 50 during a first etching process to expose the first source electrode contact region and the first drain electrode contact region of the first active layer ACT1.

Figure 5C:
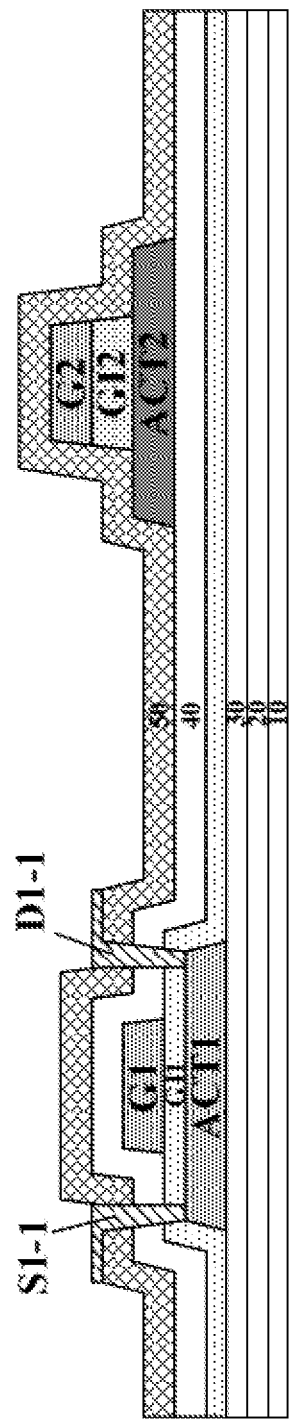

Referring to FIG. 5C, a first source sub-layer S1-1 is formed to fill in the first via V1 and a first drain sub-layer D1-1 is formed to fill in the second via V2 to protect the first active layer ACT1, e.g., to cover up exposed surface of the first active layer ACT1.

Referring to FIG. 5D, subsequent to forming the first source sub-layer S1-1 and the first drain sub-layer D1-1, a third via V3 and a fourth via V4 are formed to respectively extend through the second inter-layer dielectric layer 50 during a second etching process to expose the second source electrode contact region and the second drain electrode contact region of the second active layer ACT2.

Referring to FIG. 5E, a second source sub-layer S1-2, a second drain sub-layer D1-2, a second source electrode S2, and a second drain electrode D2 are formed in a same patterning process and optionally using a same material and a single mask plate. The second source electrode S2 is formed to fill in the third via V3, the second drain electrode D2 is formed to fill in the fourth via V4. The second source sub-layer S1-2 is formed on a side of the first source sub-layer S1-1 and electrically connected to the first source sub-layer S1-1. The second drain sub-layer D1-2 is formed on a side of the first drain sub-layer D1-1 and electrically connected to the first drain sub-layer D1-1.

In some embodiments, the first active layer ACT1 is a silicon active layer and the second active layer ACT2 is a metal oxide active layer. Optionally, prior to forming the third via V3 and the fourth via V4, the method further includes performing a crystallization process to convert an amorphous silicon material into a polycrystalline silicon material, thereby forming the first active layer ACT1, while the second active layer ACT2 is protected by the second inter-layer dielectric layer 50.

Optionally, the first source sub-layer S1-1 and the first drain sub-layer D1-1 are formed using a metallic material; and the second source sub-layer S1-2, the second drain sub-layer D1-2, the second source electrode S2, and the second drain electrode D2 are formed using a metallic material. Optionally, the first source sub-layer S1-1, the first drain sub-layer D1-1, the second source sub-layer S1-2, the second drain sub-layer D1-2, the second source electrode S2, and the second drain electrode D2 are formed using a same metallic material.

Referring to FIG. 5F, a planarization layer 60 is formed on a side of the first source electrode S1, the first drain electrode D1, the second source electrode S2, and the second drain electrode D2 away from the base substrate 10. A via is formed to extending through the planarization layer 60 to expose a surface of the second drain electrode D2.

Referring to FIG. 5G, a pixel electrode 70 is formed on a side of the planarization layer 60 away from the base substrate 10. The pixel electrode 70 is formed to be electrically connected to the second drain electrode D2 through the via extending through the planarization layer 60.

Figure 5H:
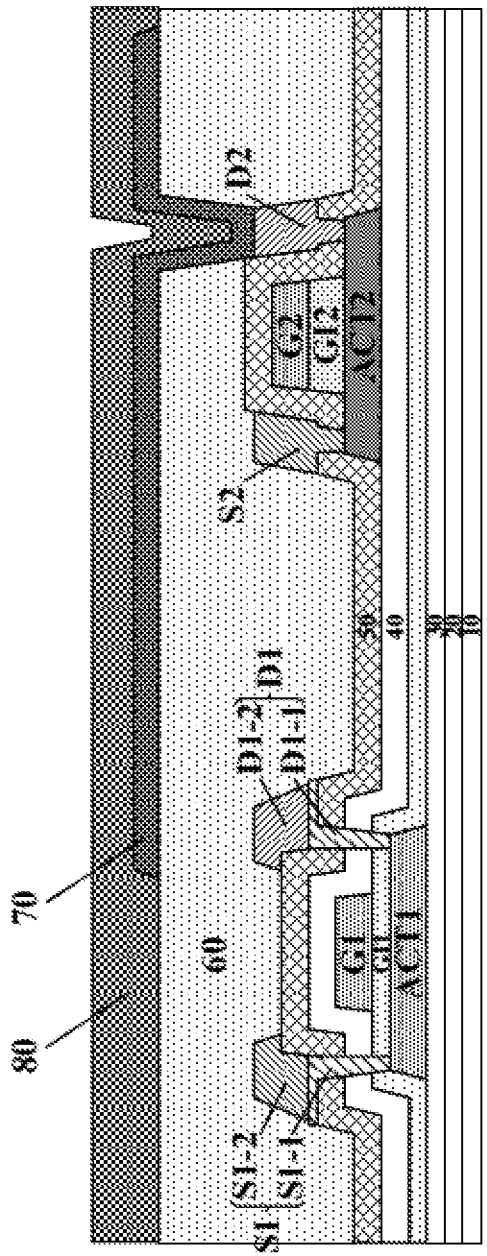

Referring to FIG. 5H, an insulating layer 80 is formed on a side of the pixel electrode 70 away from the base substrate 10.

Figure 5I:
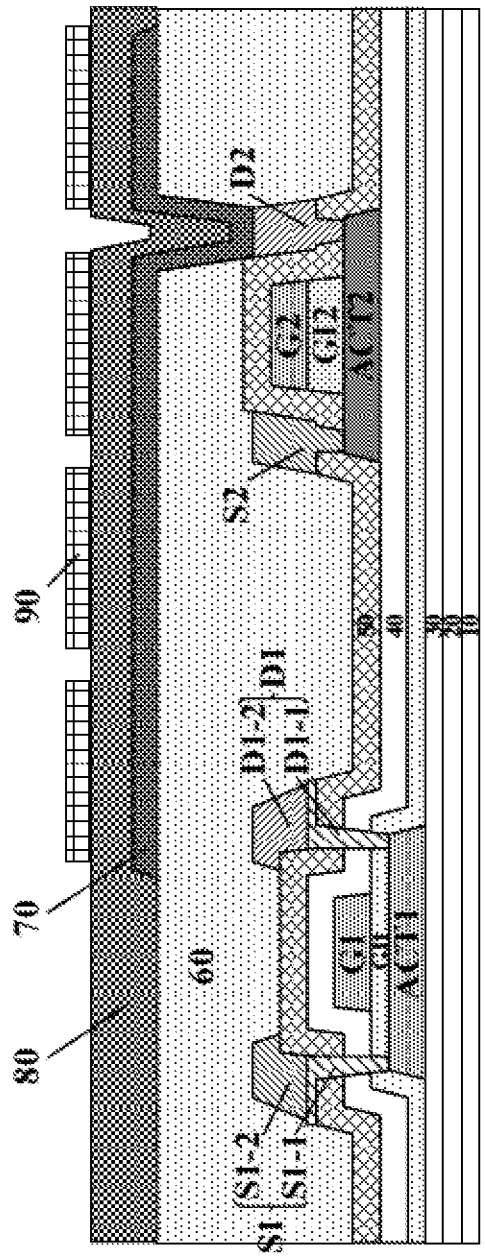

Referring to FIG. 5I, a common electrode 90 is formed on a side of the insulating layer 80 away from the base substrate 10.

In another aspect, the present disclosure provides an array substrate. In some embodiments, the array substrate includes a plurality of first thin film transistors and a plurality of second thin film transistors on a base substrate. A respective one of the plurality of first thin film transistors includes a first active layer, a first gate electrode, a first source electrode and a first drain electrode. A respective one of the plurality of second thin film transistors includes a second active layer, a second gate electrode, a second source electrode and a second drain electrode. The first source electrode includes a first source sub-layer and a second source sub-layer on a side of the first source sub-layer away from the base substrate. The first drain electrode includes a first drain sub-layer and a second drain sub-layer on a side of the first drain sub-layer away from the base substrate. The first source sub-layer and the first drain sub-layer are in a same layer and made of a same material. The second source sub-layer, the second drain sub-layer, the second source electrode, and the second drain electrode are in a same layer and made of a same material. Optionally, the first source sub-layer and the first drain sub-layer are made of a first metallic material; the second source sub-layer, the second drain sub-layer, the second source electrode, and the second drain electrode are made of a second metallic material different from the first metallic material.

Optionally, the plurality of first thin film transistors are metal oxide thin film transistors. Optionally, the plurality of first thin film transistors are polycrystalline silicon thin film transistors. Optionally, the plurality of second thin film transistors are metal oxide thin film transistors. Optionally, the plurality of second thin film transistors are polycrystalline silicon thin film transistors.

Optionally, the plurality of first thin film transistors are in the display area, and the plurality of second thin film transistors are in the peripheral area. Optionally, the plurality of first thin film transistors are in the peripheral area, and the plurality of second thin film transistors are in the display area.

Optionally, the plurality of first thin film transistors are drive thin film transistors (e.g., transistors connected to the power supply line and to the light emitting diode) in an organic light emitting diode array substrate. Optionally, the plurality of second thin film transistors are switch thin film transistors (e.g., transistors connected to data lines and the gate electrode of the drive transistors, i.e., address selection thin film transistors) in an organic light emitting diode array substrate. Optionally, the plurality of first thin film transistors are switch thin film transistors (e.g., transistors connected to data lines and the gate electrode of the drive transistors, i.e., address selection thin film transistors) in an organic light emitting diode array substrate. Optionally, the plurality of second thin film transistors are drive thin film transistors (e.g., transistors connected to the power supply line and to the light emitting diode) in an organic light emitting diode array substrate.

In another aspect, the present disclosure provides a display panel having an array substrate described herein or fabricated by a method described herein, and a counter substrate facing the array substrate. Optionally, the display panel is a liquid crystal display panel. Optionally, the display panel is an organic light emitting diode display panel.

In another aspect, the present disclosure provides a display apparatus having an array substrate described herein or fabricated by a method described herein, and one or more integrated circuits connected to the array substrate. Optionally, the display apparatus is a liquid crystal display apparatus. Optionally, the display apparatus is an organic light emitting diode display apparatus. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of fabricating an array substrate, comprising:
forming a plurality of first thin film transistors on a base substrate, a respective one of the plurality of first thin film transistors formed to comprise a first active layer, a first gate electrode, a first source electrode and a first drain electrode; and
forming a plurality of second thin film transistors on the base substrate, a respective one of the plurality of second thin film transistors formed to comprise a second active layer, a second gate electrode, a second source electrode and a second drain electrode;
wherein forming the first source electrode comprises forming a first source sub-layer and forming a second source sub-layer in separate patterning steps;
forming the first drain electrode comprises forming a first drain sub-layer and forming a second drain sub-layer in separate patterning steps;
the first source sub-layer and the first drain sub-layer are formed in a same layer using a same material in a same patterning process and using a single mask plate; and
the second source sub-layer, the second drain sub-layer, the second source electrode, and the second drain electrode are formed in a same layer using a same material in a same patterning process and using a single mask plate;
wherein the first active layer and the second active layer are formed in different layers;
an entire surface of the second active layer is protected and unexposed during a first etching process to expose a first source electrode contact region and a first drain electrode contact region of the first active layer; and
an entire surface of the first active layer is protected and unexposed during a second etching process to expose a second source electrode contact region and a second drain electrode contact region of the second active layer.

2. The method of claim 1, wherein the entire surface of the first active layer is unexposed and protected in part by the first source sub-layer and the first drain sub-layer during the second etching process; and
the entire surface of the second active layer is unexposed and protected by an insulating material during the first etching process.

3. The method of claim 1, wherein the first etching process is performed prior to the second etching process.

4. The method of claim 1, wherein the first active layer and the second active layer are formed as two different active layers selected from a silicon active layer and a metal oxide active layer;
the silicon active layer is formed by a crystallization process converting an amorphous silicon material into a polycrystalline silicon material; and
an entire surface of the metal oxide active layer is protected and unexposed during the crystallization process.

5. The method of claim 1, wherein the first active layer and the second active layer are formed in two different layers;
the method further comprising forming a first inter-layer dielectric layer and forming a second inter-layer dielectric layer;
the first inter-layer dielectric layer is formed between the first active layer and the second active layer; and
the second inter-layer dielectric layer is formed on a side of the first active layer and the second active layer away from the base substrate.

6. The method of claim 5, comprising:
forming a first via and a second via during the first etching process to expose the first source electrode contact region and the first drain electrode contact region of the first active layer;
forming the first source sub-layer filling in the first via and the first drain sub-layer filling in the second via to protect the first active layer;
subsequent to forming the first source sub-layer and the first drain sub-layer, forming a third via and a fourth via during the second etching process to expose the second source electrode contact region and the second drain electrode contact region of the second active layer; and
forming the second source sub-layer, the second drain sub-layer, the second source electrode, and the second drain electrode in a same patterning process, the second source electrode formed to fill in the third via, the second drain electrode formed to fill in the fourth via.

7. The method of claim 6, wherein the first inter-layer dielectric layer is formed on a side of the second active layer away from the base substrate;
the first active layer is formed on a side of the first inter-layer dielectric layer away from the base substrate; and
the second inter-layer dielectric layer is formed on a side of the first active layer away from the base substrate.

8. The method of claim 7, comprising:
forming a first via and a second via respectively extending through the second inter-layer dielectric layer during the first etching process to expose the first source electrode contact region and the first drain electrode contact region of the first active layer;
forming the first source sub-layer filling in the first via and the first drain sub-layer filling in the second via to protect the first active layer;
subsequent to forming the first source sub-layer and the first drain sub-layer, forming a third via and a fourth via respectively extending through the first inter-layer dielectric layer and the second inter-layer dielectric layer during the second etching process to expose the second source electrode contact region and the second drain electrode contact region of the second active layer; and
forming the second source sub-layer, the second drain sub-layer, the second source electrode, and the second drain electrode in a same patterning process, the second source electrode formed to fill in the third via, the second drain electrode formed to fill in the fourth via.

9. The method of claim 8, wherein the first active layer is a metal oxide active layer and the second active layer is a silicon active layer; and
subsequent to forming the first source sub-layer and the first drain sub-layer, the method further comprises performing a crystallization process to convert an amorphous silicon material into a polycrystalline silicon material, thereby forming the second active layer.

10. The method of claim 6, wherein the first inter-layer dielectric layer is formed on a side of the second active layer away from the base substrate;
the first active layer is formed on a side of the first inter-layer dielectric layer away from the base substrate; and
the second inter-layer dielectric layer is formed on a side of the first active layer away from the base substrate.

11. The method of claim 10, comprising:
forming a first via and a second via respectively extending through the first inter-layer dielectric layer and the second inter-layer dielectric layer during the first etching process to expose the first source electrode contact region and the first drain electrode contact region of the first active layer;
forming the first source sub-layer filling in the first via and the first drain sub-layer filling in the second via to protect the first active layer;
subsequent to forming the first source sub-layer and the first drain sub-layer, forming a third via and a fourth via respectively extending through the second inter-layer dielectric layer during the second etching process to expose the second source electrode contact region and the second drain electrode contact region of the second active layer; and
forming the second source sub-layer, the second drain sub-layer, the second source electrode, and the second drain electrode in a same patterning process, the second source electrode formed to fill in the third via, the second drain electrode formed to fill in the fourth via.

12. The method of claim 11, wherein the first active layer is a silicon active layer and the second active layer is a metal oxide active layer; and
prior to forming the third via and the fourth via, the method further comprises performing a crystallization process to convert an amorphous silicon material into a polycrystalline silicon material, thereby forming the first active layer.

13. The method of claim 1, wherein the respective one of the plurality of first thin film transistors and the respective one of the plurality of second thin film transistors are formed as two different thin film transistors selected from a silicon thin film transistor and a metal oxide thin film transistor; and
the metal oxide thin film transistor is formed in a display area of the array substrate, and the silicon thin film transistor is formed in a peripheral area of the array substrate.

14. The method of claim 1, wherein the respective one of the plurality of first thin film transistors and the respective one of the plurality of second thin film transistors are formed as two different thin film transistors selected from a silicon thin film transistor and a metal oxide thin film transistor;
the silicon thin film transistor is formed as a drive thin film transistor electrically connected to a power supply line and an organic light emitting diode; and
the metal oxide thin film transistor is formed as a switch thin film transistor electrically connected to a data line and a gate electrode of the silicon thin film transistor.

15. The method of claim 1, wherein the first active layer is a metal oxide active layer, and the second active layer is a silicon active layer.

16. The method of claim 1, wherein the first active layer is a silicon active layer, and the second active layer is a metal oxide active layer.

17. The method of claim 1, wherein the first source sub-layer and the first drain sub-layer are formed using a metallic material; and
the second source sub-layer, the second drain sub-layer, the second source electrode, and the second drain electrode are formed using a metallic material.

* * * * *